United States Patent [19]

Flannagan et al.

[11] Patent Number: 4,661,931
[45] Date of Patent: Apr. 28, 1987

[54] ASYNCHRONOUS ROW AND COLUMN CONTROL

[75] Inventors: Stephen T. Flannagan; Paul A. Reed, both of Austin, Tex.

[73] Assignee: Motorola, Inc., Schaumburg, Ill.

[21] Appl. No.: 762,341

[22] Filed: Aug. 5, 1985

[51] Int. Cl.$^4$ .............................................. G11C 7/00
[52] U.S. Cl. .................................... 365/203; 365/230
[58] Field of Search ............... 365/189, 190, 200, 203, 365/230, 233

[56] References Cited

U.S. PATENT DOCUMENTS

| | | | |
|---|---|---|---|
| 4,338,679 | 7/1982 | O'Toole | 365/203 |
| 4,417,328 | 11/1983 | Ochii | 365/203 |
| 4,581,718 | 4/1986 | Oistic | 365/189 |

FOREIGN PATENT DOCUMENTS 0121208 10/1984 European Pat. Off. ............ 365/203

Primary Examiner—Joseph A. Popek
Attorney, Agent, or Firm—John A. Fisher; Jeffrey van Myers; James L. Clingan, Jr.

[57] ABSTRACT

A memory circuit has a plurality of bit line pairs and intersecting word lines with a memory cell located at each such intersection. A column address selects the bit line which is to be accessed and a row address selects the word line which is enabled. In response to being selected, a bit line is coupled to a data line. In response to a column address transition, all of the bit lines are decoupled from the data lines while bit lines are precharged. In response to a row address transition, the word lines are disabled while the bit lines are equilibrated.

17 Claims, 6 Drawing Figures

ASYNCHRONOUS ROW AND COLUMN CONTROL

CROSS-REFERENCE TO RELATED APPLICATIONS

Related subject matter is disclosed in the following related applications assigned to the assignee hereof:
1. U.S. patent application No. 762,362 entitled "Bit Line Precharge On a Column Address Change," filed simultaneously herewith; and
2. U.S. patent application No. 750,637 entitled "Memory Architecture," filed July 1, 1985.

FIELD OF THE INVENTION

The present invention relates to memories which detect an address transition, and more particularly to memories which precharge and equalize bit lines in response to an address transition.

BACKGROUND OF THE INVENTION

In static random access memories (SRAMs) it has been found desirable to perform various circuit functions in response to an address transition in providing data. In SRAMs which use address transition detection (ATD), there have developed problems in losing data in some situations. There are sometimes pattern sensitivities. There are sometimes address skew problems as well. Address skew occurs when more than one address changes but not quite at the same time. In typical operation, the address skew is quite small in relation to the total access time. For a typical access in a system, the address skew is typically a nanosecond (ns) or two whereas the SRAM has an access time around 35 ns SRAM. For this type of address skew, there have been few problems. Also in a typical system, however, there are occasions in which the addresses are rapidly changing for a relatively long time, for example 25 ns, before becoming valid. This is the condition in which failures have been more likely to occur. Although reasons for the occurrence of the problem have been difficult to measure, one of the causes addressed in the present invention is related to the fact that, in the typical prior art ATD memory circuit, the word lines can be activated during severe address skew. When the word line is activated, the SRAM cells that are on that row are enabled and are attempting to differentiate the voltage on the bit lines. If another word line is then accessed, the bit line may be sufficiently differentiated that the newly activated cells may have their data reversed, particularly if the cell is relatively weak. Under typical addressing situations this problem is handled by ensuring that the bit lines have been equalized before activating the next word line. Under severe address skew conditions, which are likely to occur occasionally, the bit lines may not, however, get equalized sufficiently, causing the occasional loss of data.

Another complicating factor is the desirability of turning off major portions of the memory between cycles when operating at less than the maximum cycle frequency. This is generally handled with a cycle end timer which turns off some power consuming portions at the end of a cycle. This results in significant power savings when operating at relatively low cycle rates. This does, however, add circuit complexity which can potentially add to the cycle length when there is an access after the timer has timed out.

SUMMARY OF THE INVENTION

An object of the present invention is to provide improved row and column control in a memory.

Another object of the invention is to provide an improved memory with improved row and column control.

Yet another object of the invention is to provide an improved technique for preventing more than one word line from being simultaneously active.

These and other objects are achieved in a memory circuit which has a plurality of bit line pairs which are selected by a column address and a plurality of word lines which are selected by a row address, the bit line pairs being selectively coupled to a common data line by column decoders as determined by the column address and the word lines being selectively enabled by a row decoder as determined by the row address, a memory cell being located at each intersection of the bit line pairs and word lines. The memory circuit comprises a row detection circuit, a column detection circuit, a disabling circuit, and a decoupling circuit. The row detection circuit generates a row transition signal in response to detecting a row address transition. The column detection circuit generates a column transition signal in response to detecting a column address transition. The disabling circuit disables the row decoder in response to the row transition signal. The decoupling circuit decouples the bit lines from the data lines in response to the column transition signal.

DESCRIPTION OF THE INVENTION

Figure 1:
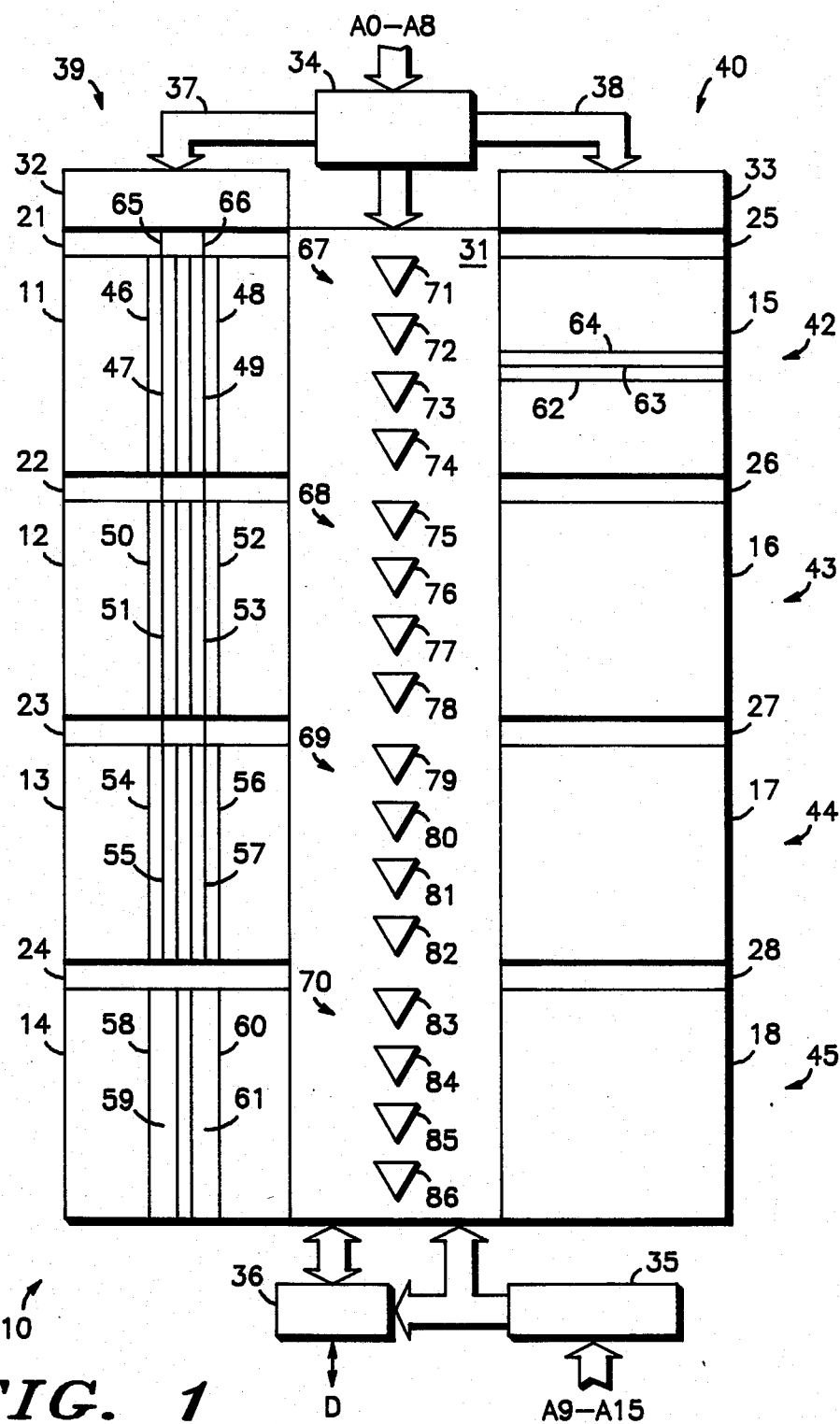
FIG. 1 is a layout of a memory useful in understanding the present invention.

Shown in FIG. 1 is a memory 10 in layout form showing the physical relationship of the certain important functional blocks which comprise a memory architecture. Memory 10 comprises 8 sub-arrays 11, 12, 13, 14, 15, 16, 17, and 18; 8 word line driver blocks 21, 22, 23, 24, 25, 26, 27, and 28; a column block 31; a left global row decoder 32; a right global row decoder 33; a row address buffer/control block 34; a column address buffer/control block 35; and a control data I/O block 36. The various functional blocks are located primarily in relation to each other in layout form as is typical of architecture definition in a memory. FIG. 1 shows the architecture in two dimensional form with a top and a bottom, and a left and a right. The row address buffer/control block 34 is at the top with a bus 37 running down and to the left to the left global row decoder block, and with a bus 38 running down and to the right to the right global row decoder 32. Word line driver block 21 is immediately below row decoder 32. Sub-array 11 is immediately below word line driver 21. Word line driver 22 is immediately below sub-array 11. Sub-array 12 is immediately below driver 22. Word line driver 23 is immediately below sub-array 12. Sub-array 13 is immediately below driver 23. Word line driver 24 is immediately below sub-array 13. Sub-array 14 is immediately below driver 24. Word line driver block 25 is immediately below row decoder 33. Sub-array 15 is immediately below word line driver 25. Word line driver 26 is immediately below sub-array 15. Sub-array 16 is immediately below driver 26. Word line driver 27 is immediately below sub-array 16. Sub-array 17 is immediately below driver 27. Word line driver 28 is immediately below sub-array 17. Sub-array 18 is immediately below driver 28. Sub-arrays 11–14, which run in a top to bottom direction, form a column 39 of sub-arrays. Sub-arrays 15–18, which run in a top to bottom direction, form a column 40 of sub-arrays. Sub-arrays 11 and 15 which run in a left to right direction, form a row 42 of sub-arrays. Sub-arrays 12 and 16, which run in a left to right direction, form a row 43 of sub-arrays. Sub-arrays 13 and 17, which run in a left to right direction, form a row 44 of sub-arrays. Sub-arrays 14 and 18, which run in a left to right direction, form a row 45 of sub-arrays. Column block 31 runs between, and in parallel with, columns 39 and 40. Column block 31 is thus interposed and breaks into each of rows 42–45. Word line drivers 21–24 are on top of sub-arrays 11–14, respectively, of column 39. Word line drivers 25–28 are on top of sub-arrays 15–18, respectively. As used herein, "on top of" is used in the two dimensional planar sense as is appropriate for describing an architecture.

Sub-arrays 11–18 each have 128 overlying bit line pairs and 64 overlying word lines. As used herein, "overlying" is used in the three dimensional sense. The use of word lines and bit lines is well known in the art. By way of example, 4 word lines are shown for each of sub-arrays 11–14, and 3 bit lines are shown for sub-array 15. The word lines run in a top to bottom direction, and the bit lines run in a left to right direction. For sub-array 11, word lines 46–49 are shown. For sub-array 12, word lines 50–53 are shown. For sub-array 13, word lines 54–57 are shown. For sub-array 14, word lines 58–61 are shown. For sub-array 15, bit line pairs 62–64 are shown. Columns 39 and 40 each have 32 row select lines which run in the top to bottom direction. By way of example, row select lines 65 and 66 are shown for column 39. For each row select line there are two corresponding word lines adjacent to that row select line for each sub-array in the particular column. Each word line is adjacent to only one row select line, that being the corresponding row select line. Row select line 65 has corresponding word lines 46–47, 50–51, 54–55, and 58–59. Row select line 66 has corresponding word lines 48–49, 52–53, 56–57, and 60–61. Row select lines 65 and 66 extend from row decoder 32 to word line driver 24, overlying sub-arrays 11–13 therebetween.

The word lines are formed in two layers. One layer is polysilicon which forms the gates of transfer transistors which enable individual memory cells. The other layer is metal which overlies the polysilicon word lines. Each overlying metal word line is strapped to a corresponding polysilicon word line to increase the speed with which the memory cells are accessed. This strapping of overlying metal to polysilicon for high speed word lines is known in the art. The row select lines are metal lines formed in the same layer as the metal word lines. The row select lines carry information used by the word line drivers so terminate with the last word line driver. The row select lines, thus need not extend to overlie the last sub-array in the column of sub-arrays. As shown, row select lines 65 and 66 do not extend to overlie sub-array 14, the last sub-array in column 39. Each row select line runs between the word lines which correspond to that row select line over all but the last sub-array. As shown in FIG. 1, row select line 65 runs between word lines 46 and 47 over sub-array 11, and between word lines 50 and 51 over sub-array 12, and between word lines 54 and 55 over sub-array 13.

Column block 31 is coupled to sub-arrays 11–18, word line drivers 21–28, block 34, block 35, and block 36. Column block 31 provides column decoding, local sensing of data, routing of sub-array selection signals, and data routing. There are 65,536 memory locations defined by the 16 address signals A0–A15. Address signals A0–A8 define which word line is activated (or enabled). With 64 word lines and 8 sub-arrays this is a one of 512 selection. Column block 31 routes the sub-array selection signals to the word line drivers to aid in the word line enabling process. Each column 39, 40 has 32 row select lines so there are a total of 64 row select lines. Address signals A0–A5 provide a one of 64 selection to define which of the row select lines is activated. One of the two word lines which correspond to the activated row select line will be activated. This one of two selection is determined by address A6. Address A5 defines between left and right, i.e., between column 39 and 40. Block 34 provides 16 sub-array selection signals to column block 31. Each word line driver block receives two of these sub-array selection signals. For a given word line selection, only one of the 16 sub-array selection signals is activated. The reason each word line driver block receives two sub-array selection signals is to select between the two word lines which correspond to and are adjacent to the activated row select line. Address signals A7 and A8 define which sub-array within a column of sub-arrays is selected. Address signals A5, A7, and A8 define which sub-array is activated for purposes of precharging as well as word line selection.

In a read mode, when one of signals A0–A8 switches state, a row address transition signal is activated which causes the selected sub-array to be precharged. This has become a typical technique in high speed SRAMS. The precharging of a sub-array is to precharge and equalize the bit lines thereof. This precharging is a significant portion of the power consumed by the memory. As such a significant power saving is achieved by precharging only the sub-array which is to provide data. Address signals A5, A7, and A8 determine which single sub-array is precharged in response to an address transition of one or more of address signals A0–A8. All other sub-arrays remain precharged and deselected.

In conjunction with a word line being activated, column block 31 provides decoding and sensing in order to obtain the selected data from the activated sub-array in the read mode. Address signals A9–A15 provide a one of 128 selection to define which bit line within the sub-array will provide the data. In the sensing procedure as well as the word line selection procedure, the activated sub-array must be determined. The sub-array selection signals are also useful for this purpose because they define which sub-array is selected. There are four sets of sense amplifiers 67, 68, 69, and 70 present in column block 31, corresponding to rows 42, 43, 44, and 45, respectively. Each set of sense amplifiers is comprised of four sense amplifiers. Set 67 is comprised of sense amplifiers 71-74 in close proximity to corresponding sub-arrays 11 and 15. Set 68 is comprised of sense amplifiers 75-78 in close proximity to corresponding sub-arrays 12 and 16. Set 69 is comprised of sense amplifiers 79-82 in close proximity to corresponding sub-arrays 13 and 17. Set 70 is comprised of sense amplifiers 83-86 in close proximity to corresponding sub-arrays 14 and 18. Predecoding defined by address signals A9-A13 couples 4 bit line pairs from an activated sub-array to respective sense amplifiers which correspond to the activated sub-array.

Figure 2:
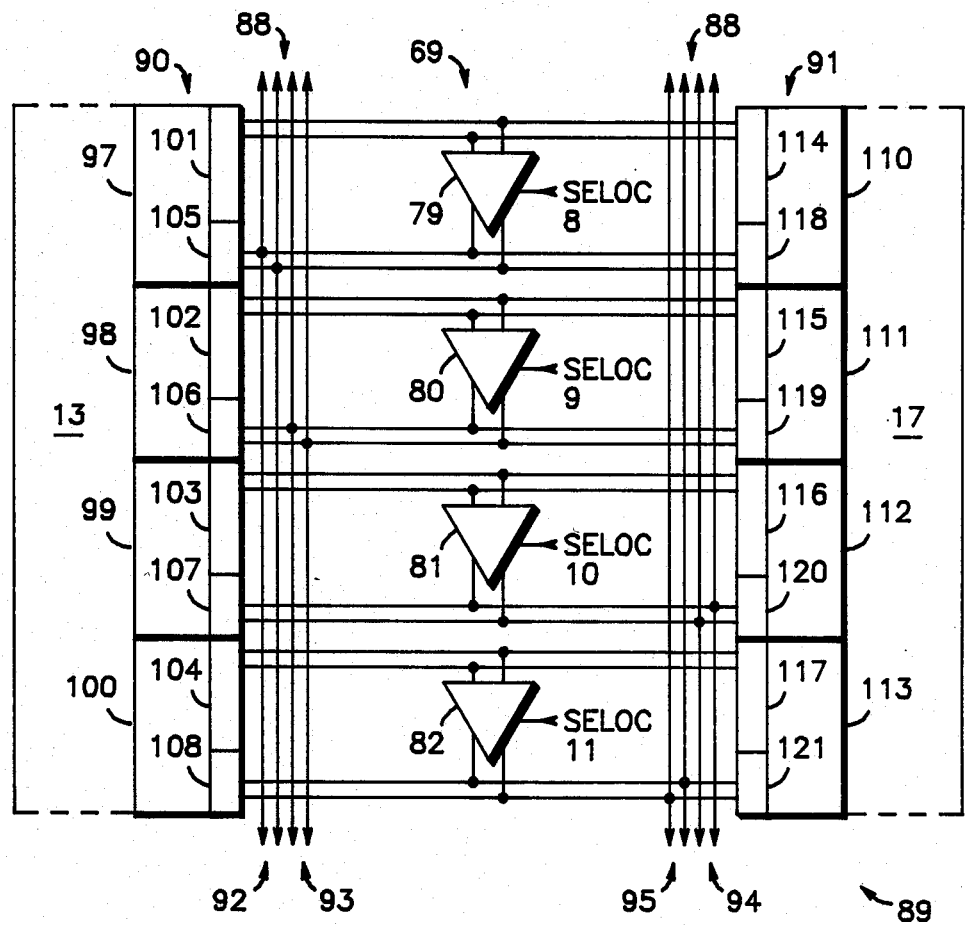
FIG. 2 is a block diagram of a portion of the memory circuit of FIG. 1.

Global data lines 88 not shown in FIG. 1 but shown in FIG. 2 are routed from sense amplifiers 71-86 through column block 31 to block 36. Shown in FIG. 2 is a portion 89 of column block 31 and sub-arrays 13 and 17. Portion 89 comprises a column decoder portion 90 coupled to sub-array 13, a column decoder portion 91 coupled to sub-array 17, set of sense amplifiers 69, as well as global data lines 88. Four pairs of data lines 92, 93, 94, and 95 comprise global data lines 88. Each of the sets of sense amplifiers 67-70 has outputs controllably coupled to these four data line pairs 92-95. Which set of amplifiers that is coupled to the data line pairs is defined by address signals A7 and A8. Each set of amplifiers 67-70 has inputs which are controllably coupled to one of the two sub-arrays that are in the same row. Which one of the four pairs of data lines 92-95 is selected for data is determined by address signals A14 and A15. Signals A14 and A15 also define which of the four sense amplifiers within the set of amplifiers is not disabled. The control signals necessary to provide the one of four data pair selection are coupled from block 35 to block 36.

In a write mode the word line selection is the same as for the read mode. In the write mode the bit line pairs need not be precharged. The column decoding is also very similar. A write driver is employed instead of sense amplifiers. The write driver is located in block 36. Address signals A14 and A15 determine which pair of global data lines 88 carry the data to be written. The sense amplifiers are all made to be high impedance, commonly known as tri-stated. The sense amplifiers are bypassed in the write mode so that the selected data line pair is coupled to the column decoder. For a given address, there are 4 data paths made available between the selected sub-array and the set of sense amplifiers for that sub-array. A bypass for each between the global data lines and the decoders establishes 4 paths to the sub-array when only one is desized. Three of these potential data paths are blocked as determined by address signals A14 and A15.

Shown in FIG. 2 are more details helpful in describing the data selection and sensing process provided by column block 31. Column decoder 90 is comprised of four column pre-decoders 97, 98, 99, and 100; four secondary column decoders 101, 102, 103, and 104; and four write coupling circuits; 105, 106, 107, and 108. Similarly, column decoder 91 is comprised of four column pre-decoders 110, 111, 112, and 113; four secondary column decoders 114, 115, 116, and 117; and four write coupling circuits; 118, 119, 120, and 121. Each of the other sub-array pairs 11-15, 12-16, and 14-18 also have an associated four column pre-decoders, four secondary column decoders, and four write coupling circuits. Sense amplifiers 71-86 each receive a select operating clock unique to that amplifier designated SELOC 0-15. As shown in FIG. 2, amplifiers 79, 80, 81, and 82 receive clocks SELOC 8, SELOC 9, SELOC 10, and SELOC 11. Only one of the SELOC clocks is active for a given data access in the read mode. In the write mode, all of the SELOC clocks are inactive.

Assume as an example that data from sub-array 13 is to be output on data line pair 92. A word line in sub-array 13 is activated as determined by address signals A0-A8. Decoders 97-100 all respond to the address by providing an output to secondary decoders 101-104, respectively. Decoders 97-100 are each coupled to one fourth of the 128 bit line pairs of sub-array 13 which is 32 bit line pairs. Decoders 97-100 provide a 2 of 32 selection so that two bit line pairs are coupled to each of secondary decoders 101-104 via decoders 97-100. Secondary decoders 101-104 each have a pair of outputs coupled to inputs of amplifiers 79-82, respectively. Secondary decoders 101-104 perform a one of two selection to couple a bit line pair to each of amplifiers 79-82. The one of two selection is determined by the state of address signal A9. Secondary decoders 114-117 all are tri-stated to provide a high impedance output. Amplifiers 79-82 each have a pair of outputs coupled to data line pairs 92-95, respectively. In the present example, SELOC 8 is activated while clocks SELOC 9-11 remain inactive so that only amplifier 79 is activated. Consequently, the data carried by the pair of bit lines coupled to amplifier 79 is provided onto data line pair 92 where it is received by block 36. In the inactive state, amplifiers 80-82 are tri-stated.

If a write is to occur into sub-array 13 via data line pair 92, a word line in sub-array 13 is activated as determined by address signals A0-A8. All of clocks SELOC 8-11 will be inactive so that amplifiers 79-83 will be tri-stated. Block 36 provides the data onto data line 92 as determined by address signals A14 and A15. In response to the address, decoder 97 has two bit line pairs coupled to write coupling circuit 105. Write coupling circuit 105 couples data line 92 to one of these pairs as determined by address signal A9. Thus the data is coupled to the selected memory cell at the intersection of the activated word line and the selected bit line pair.

Figure 3:
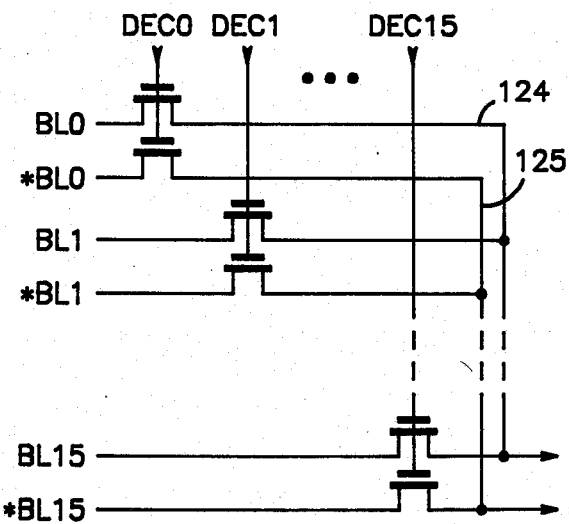
FIG. 3 is circuit diagram of a first portion of the block diagram of FIG. 2.

Decoders 97-100 and 110-113 each have two pass gate portions like pass gate circuit 123 shown in FIG. 3 for coupling bit lines to secondary decoders 101-104 and 114-117. There are 16 decoded address signals DEC0-DEC15 which are generated in response to address signals A10-A13 for coupling one of 16 bit lines to a local data line. In a selected sub-array as determined by address signals A5, A7, and A8, one of signals DEC0-DEC15 is activated for each pass gate circuit. There are 8 pass gate circuits for each sub-array. In the deselected sub-arrays, all signals DEC0-DEC15 are held inactive. As shown in FIG. 3, bit lines BL0-BL15 are selectively coupled to a local data line 124 and the complementary bit lines *BL0-*BL15 are selectively coupled to local data line 125. The coupling from bit line to local data line is achieved with a single pass gate for each bit line so that there are 16 pass gates per local data line. Each secondary decoder 101-104 and 114-117 is coupled to 2 corresponding data line pairs. The single pass gate is shown to be an N channel transistor. It is preferred, however, to have an additional P channel in parallel with the N channel transistors which are enabled by signals complementary to the DEC0-DEC15 signals. This can be viewed as using conventional transmission gates for the pass gates. Each secondary decoder is coupled to 2 local data line pairs. Each corresponding write coupling circuit is also coupled to the same pair of local data lines.

Figure 4:
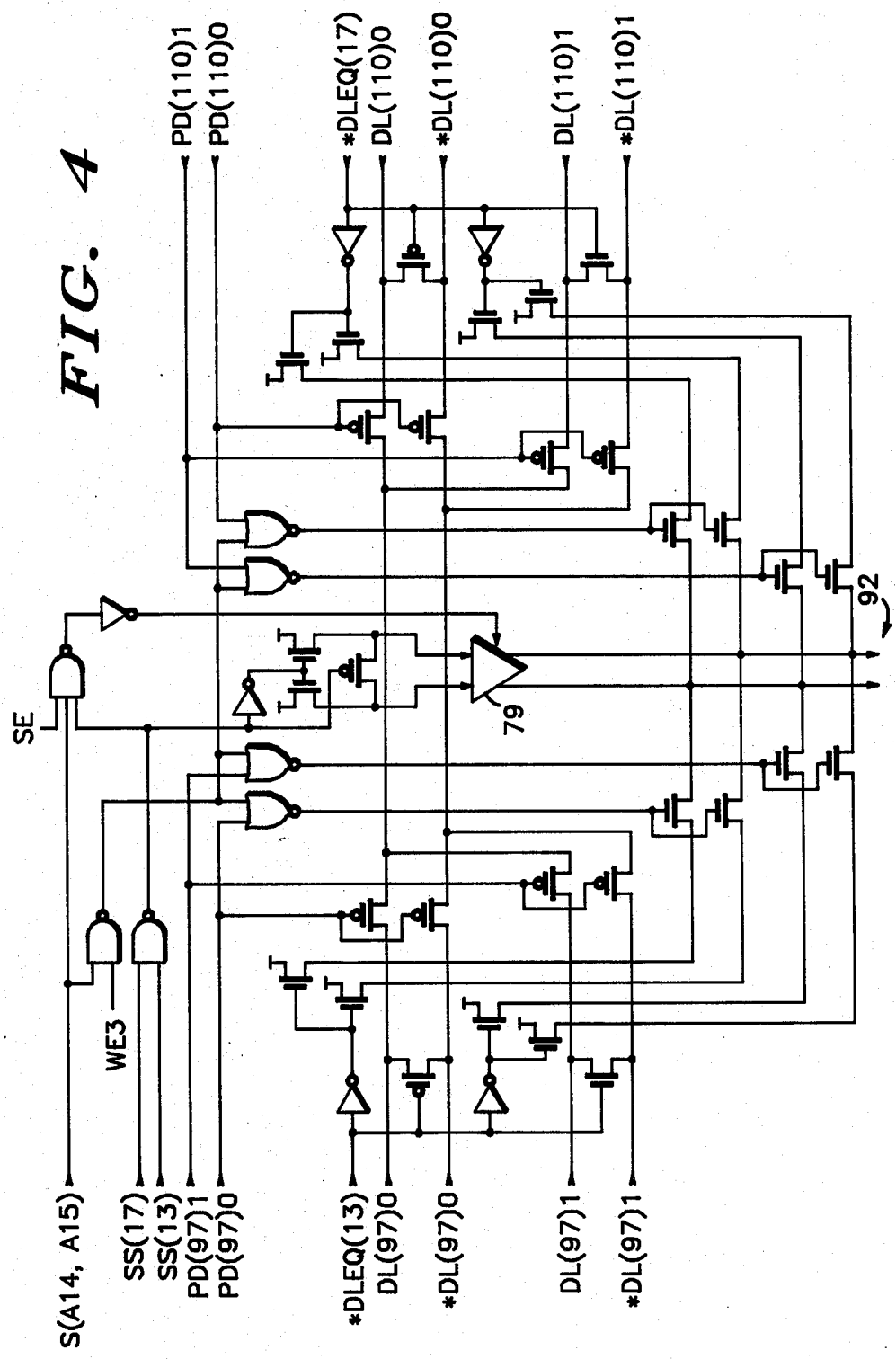
FIG. 4 is a combination block and circuit diagram of a second portion of the block diagram of FIG. 2.

Shown in FIG. 4 is a circuit/logic diagram of secondary decoders 101 and 114, and write coupling circuits 105 and 118. Sense amplifier 79 is also shown in FIG. 4. Signals DL(97)0, *DL(97)0, DL(97)1, and *DL(97)1 are the decoded outputs of decoder 97 present on the local data lines thereof. Similarly, signals DL(110)0, *DL(110)0, DL(110)1, and DL(110)1 are the decoded outputs of decoder 110 present on the local data lines thereof. Signals *DLEQ(13) and *DLEQ(17) are equalization pulses generated in response to a row or column address transition and controlled by address signals A5, A7, and A8 to activate only the equalization pulse corresponding to the selected sub-array. Signals PD(97)1, PD(97)0, PD(110)1, and PD(110)0 are selected to be active by address signals A5, A7, A8, and A9 to enable a selected pass device. Signals SS(13) and SS(17) are defined by address signals A5, A7, A8 as sub-array select signals. Signal WE3 is a write enable signal which is active as a logic high during a write. Signal S(A14, A15) is a sense amplifier selection signal defined by address signals A14 and A15. Signal SE is a sense amplifier enable signal which will disable all of the sense amplifiers when it is a logic low. The transistors which have a circle on the gate are P channel transistors and the others are N channel.

Figure 5:
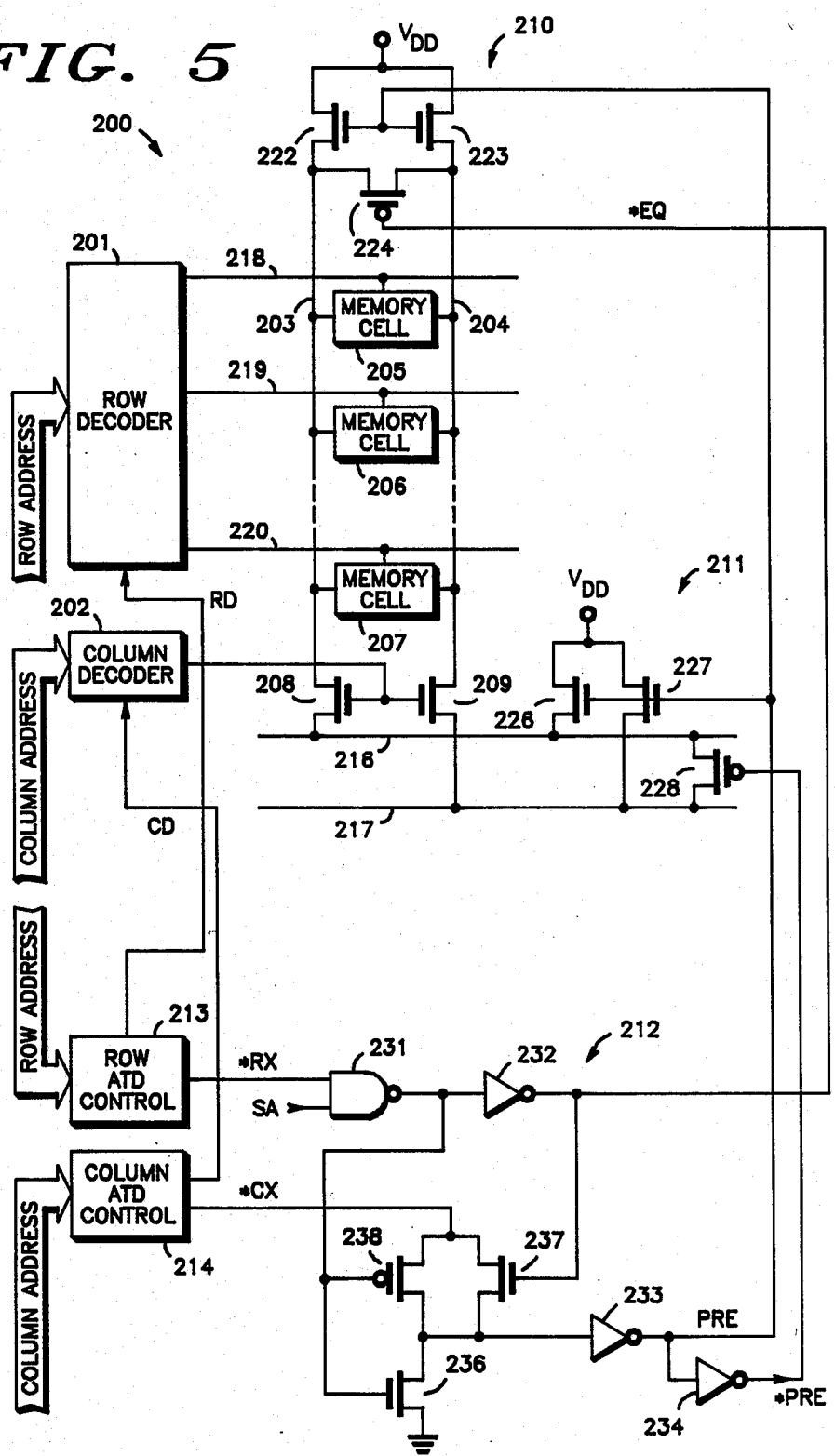
FIG. 5 is a combination block diagram and circuit diagram of a precharge and decoder control circuit according to a preferred embodiment of the invention.

Shown in FIG. 5 is a portion 200 of memory 10, comprised generally of a generalized row decoder 201, a generalized column decoder 202, bit lines 203 and 204, memory cells 205, 206, and 207, decoder coupling transistors 208 and 209, a bit line equilibration circuit 210, a data line equilibration circuit 211, an equilibration logic circuit 212, a row address transition detection (ATD) and control circuit 213, a column ATD and control circuit 214, data lines 216 and 217, and word lines 218, 219, and 220. Bit line equilibration circuit 210 comprises N channel transistors 222 and 223 and P channel transistor 224. Data line equilibration circuit 211 comprises N channel transistors 226 and 227 and P channel transistor 228. Equilibration logic circuit 212 comprises a NAND gate 231, inverters 232, 233, and 234, N channel transistors 236 and 237, and P channel transistor 238.

Memory cells 205-207 are conventional static RAM memory cells having inputs coupled to word lines 218-220, respectively, and complementary outputs coupled to bit lines 203 and 204, respectively. Transistor 208 has a gate connected to an output of column decoder 202, a first current electrode connected to bit line 203, and a second current electrode connected to data line 216. Transistor 209 has a gate connected to the output of decoder 202, a first current electrode connected to bit line 204, and a second current electrode connected to data line 217. Transistor 222 has a drain connected to a positive power supply terminal VDD which can be, for example, 5 volts, a gate for receiving a precharge signal PRE generated by logic circuit 212, and a source connected to bit line 203. Transistor 223 has a drain connected to VDD, a gate for receiving signal PRE, and a source connected to bit line 204. Transistor 224 has a first current electrode connected to bit line 203, a second current electrode coupled to bit line 204, and a gate for receiving an equalization signal *EQ generated by logic circuit 212. Transistor 226 has a drain connected to VDD, a source connected to data line 216, and a gate for receiving signal PRE. Transistor 227 has a drain connected to VDD, a source connected to data line 217, and a gate for receiving signal PRE.

Transistor 228 has first current electrode connected to data line 216, a second current electrode connected to data line 217, and a gate for receiving a signal complementary to precharge signal *PRE generated by logic circuit 212. NAND gate 231 has a first input for receiving a row transition signal *RX generated by row ATD and control circuit 213, a second input for receiving a sub-array select signal SA, and an output. Inverter 232 has an input connected to the output of NAND gate 231, and an output for providing signal *EQ. Transistor 236 has a source connected to ground, a gate connected to the output of NAND gate 231, and a drain. Transistor 237 has a first current electrode connected to the drain of transistor 236, a gate for receiving signal *EQ, and a second electrode for receiving a column transition signal *CX generated by column ATD and control circuit 214. Transistor 238 has a gate connected to the gate of transistor 236, a first current electrode for receiving signal *CX, and a second electrode connected to the drain of transistor 236. Inverter 233 has an input connected to the drain of transistor 236, and an output for providing signal PRE. Inverter 234 has an input connected to the output of inverter 233, and an output for providing signal *PRE.

Circuit 213 receives the row address and detects a change thereof. When there is a row change, circuit 213 causes signal *RX to switch to a logic low from its normal logic high. Signal *RX pulses to a logic low and switches back to a logic high in about 5 nanoseconds (ns) if there is no address skew. With address skew, signal *RX will remain at a logic low longer. As long as the row address transitions remain relatively close together, signal *RX will remain at a logic low, then switch back to a logic high after the address transitions have been completed. Circuit 214 provides signal *CX in the same way except it does it for column address transitions. Row decoder 201, when enabled, selects a word line such as one of word lines 218-220 as determined by the row address received by row decoder 201. Similarly, decoder 202, when enabled, enables transistors 208 and 209 when selected to do so by the column address. Column decoder 202, of course, has many other outputs (not shown in FIG. 5) which are selectively enabled in order to enable other bit line coupling transistors (also not shown in FIG. 5) as selected by the column address. Circuit 213 provides a row disable signal RD to disable row decoder 201 and a column disable signal to disable column decoder 202. Signals RD and CD each perform their disabling function at a logic low.

When operating at or near the shortest time between cycles, signal RD is a logic high except for the time duration that signal *RX is a logic low during which time RD is also a logic low, disabling row decoder 201 for the time duration that signal *RX is a logic low. For longer times between cycles, signal RD will switch to a logic low to disable row decoder 201 between the end of one cycle and the beginning of the next. The effect of disabling row decoder 201 is to disable all of the word lines in memory 10, such as word lines 218-220 in FIG. 5. The purpose of doing this between cycles is to reduce power consumption. The purpose of disabling the word lines when signal *RX is a logic low is to prevent any word lines from being enabled during equalization. Bit lines 203 and 204 are equalized in response to signal *RX switching to a logic low. For the most common case signal *RX pulses low for about 5 ns, but can extend to longer periods with address skew. NAND gate 231 is forced to provide a logic high output in response to signal *RX switching to a logic low. Signal SA is indicative of which sub-array among sub-arrays 11–18 of FIG. 1 is selected. Each of sub-arrays 11–18 has a circuit such as circuit 212 for receiving signals *RX and *CX. The particular sub-array signal for the selected sub-array is active when it is a logic high. When signal SA is a logic high, NAND gate 231 can respond to signal *RX. In the deselected sub-arrays, the corresponding signal SA is a logic low which forces NAND gate 231 to provide a logic high output. For the selected case, NAND gate 231 provides the logic pulse of signal *RX as a logic high pulse to inverter 232 which in turn provides signal *EQ as a logic low pulse. While signal *EQ is a logic low, transistor 224 is conductive, equalizing bit lines 203 and 204 by coupling them together. When signal *EQ is a logic high, transistor 224 is not conducting so that bit lines 203 and 204 are not coupled together. Signal *EQ is only a logic low in response to a row address transition in the case of that sub-array being selected. A column address transition will not cause signal *EQ to switch to a logic low so that transistor 224 does not equalize bit lines 203–204 in response to a column change. When the sub-array is deselected, NAND gate 231 is forced to provide a logic high output which causes inverter 232 to provide signal *EQ at a logic low. The bit lines in the deselected sub-arrays are thus all continuously equalized.

Circuit 214 provides signal *CX in response to a transition of the column address in the same way as circuit 213 provides signal *RX in response to a transition of the row address. A typical column address transition will cause signal *CX to pulse low for about 5 ns, while address skew will cause it to pulse low for a longer duration. Signal CD is functionally the same as signal *CX but circuit 214 provides it with a different output driver. Column decoder 202 is enabled as long as signal CD is a logic high. Upon a column address transition, signals *CX and CD pulse low causing column decoder 202 to be disabled so that no coupling transistors such as 208 and 209 will be enabled, thus isolating all of the bit lines from the data lines such as data lines 216 and 217. If the column address selects bit line pair 203–204, coupling transistors 208 and 209 switch from a conductive to a non-conductive state in response to signal CD switching to a logic low, isolating bit line pair 203–204 from data line pair 216–217. In the case in which there is only a column address transition, signal *EQ provided by inverter 232 is a logic high so that transistor 237 is conducting, and the output of NAND gate 231 is a logic low so that transistor 238 is conducting. Transistors 237 and 238 act as a conventional CMOS transmission gate. Prior to signal *CX switching to a logic low it is of course a logic high so that the input of inverter 233 receives a logic high via the transmission gate formed by transistors 237 and 238. Inverter 233 thus provides signal PRE at a logic low prior to the column address transition. Correspondingly, inverter 234 provides signal *PRE at a logic high prior to the column address transition. When signal *CX does pulse low, this logic low is coupled to inverter 233 via transistors 237 and 238 causing signal PRE to pulse high and signal *PRE to pulse low. Signal PRE at a logic high causes bit line precharging transistors 222 and 223 and data line precharging transistors 226 and 227 to become conductive. Data line equalizing transistor 228 is made conductive by signal *PRE switching to a logic low. Data lines 216 and 217 are equalized and precharged at about one N channel threshold voltage below VDD. For a deselected sub-array, NAND gate 231 is forced to provide a logic high output which causes transistor 236 to pull the input of inverter 233 to a logic low so that signal PRE and signal *PRE cause bit lines 203 and 204 and data lines 216–217 to be precharged. Because the deselected sub-arrays have no active word lines, the bit lines do not separate in the deselected sub-arrays. The bit lines and data lines being precharged and equalized is merely a sustaining action so that there is virtually no current drain due to the precharging transistors being conductive. By preventing any of the bit lines in the deselected sub-arrays from being discharged, the deselected sub-arrays do not experience the adverse power drain effects of precharging. Sustaining the precharge voltage while preventing any word lines from being enabled thus has the effect of decoupling the deselected sub-arrays from precharging and its disadvantageous effects.

The bit lines for a column address transition in a selected array, however, are only precharged and not equalized. Although it may appear that bit lines 203 and 204 will be equalized by virtue of being precharged to the same voltage, such is not the case. Prior to the column address transition a word line on the bit line pair was enabled and thus a memory cell on the bit line pair was actively coupled to the bit line pair so that one bit line is pulled to a lower voltage than the other. Assume that the row address has selected word line 219 so that row decoder 201 has enabled word line 219 and thereby enabling memory cell 206. Enabled memory cell 206 causes bit lines 203 and 204 to separate in voltage by pulling down one or the other bit line depending on which logic state memory cell 206 is in. Assume that bit line 203 is the relatively high side, and bit line 204 is the relatively low side and still assume that column decoder 202 had coupled bit line pair 203–204 to data line pair 216–217 prior to a column only address transition. Upon the column only address transition, simultaneously bit line pair 203 and 204 are decoupled from data line pair 216–217, bit line pair 203 and 204 are precharged, and data line pair 216–217 are equilibrated. The precharging of the bit lines raises the voltage on both bit lines 203 and 204. The logic high of bit line 203 deteriorates with time. Memory cell 206, by virtue of the nature of SRAM cells can very effectively sustain a logic low on a bit line but is not nearly so effective in sustaining a logic high. A SRAM cell can sink current much more effectively than it can source current. Being coupled to the bit line causes the logic high side of the selected memory cell to degrade. Precharging the high side of the bit line keeps it from the adverse effects of degrading. Precharging the logic low side is not harmful because the enabled memory cell can, by sinking some current, keep the bit line sufficiently low to avoid risking reversing the data in the memory cell. Several accesses of bit line pair 203–204 without a row address change would result in a continuous drop in voltage on logic high bit line 203 if it were not precharged. This is called "walk-down" and can result in the loss of data if the logic high bit line drops close enough to the logic low bit line. Cells in a SRAM are not all perfectly balanced so that bringing the logic high bit line close to the logic low bit line can reverse the data in the enabled cell when the voltage level on the bit lines becomes relatively low. Included in the cross-coupled nature of a SRAM cell is the characteristic that the logic high drives the current sinking capability of the logic low.

When the logic high is reduced, the current sinking capability of the logic low is reduced, making the memory cell susceptible to data loss. Bit failures and address pattern sensitivities have been experienced in rapid column-only address transitions in the prior art.

In the case in which there is a row address transition, signal *RX switches to a logic low causing NAND gate 231 to provide a logic high output and inverter 232 to provide a logic low output. This causes the transmission gate of transistors 237 and 238 to be non-conductive and transistor 236 to be conductive. The input to inverter 233 thus switches to a logic low, causing signal PRE to switch to a logic high and signal *PRE to switch to a logic low. This causes transistors 222, 223, 224, 226, 227, and 228 to all be conducting so that bit line pair 203-204 and data line pair 216-217 are both equilibrated in response to a row address transition without regard to whether or not there is a column address transition.

Figure 6:
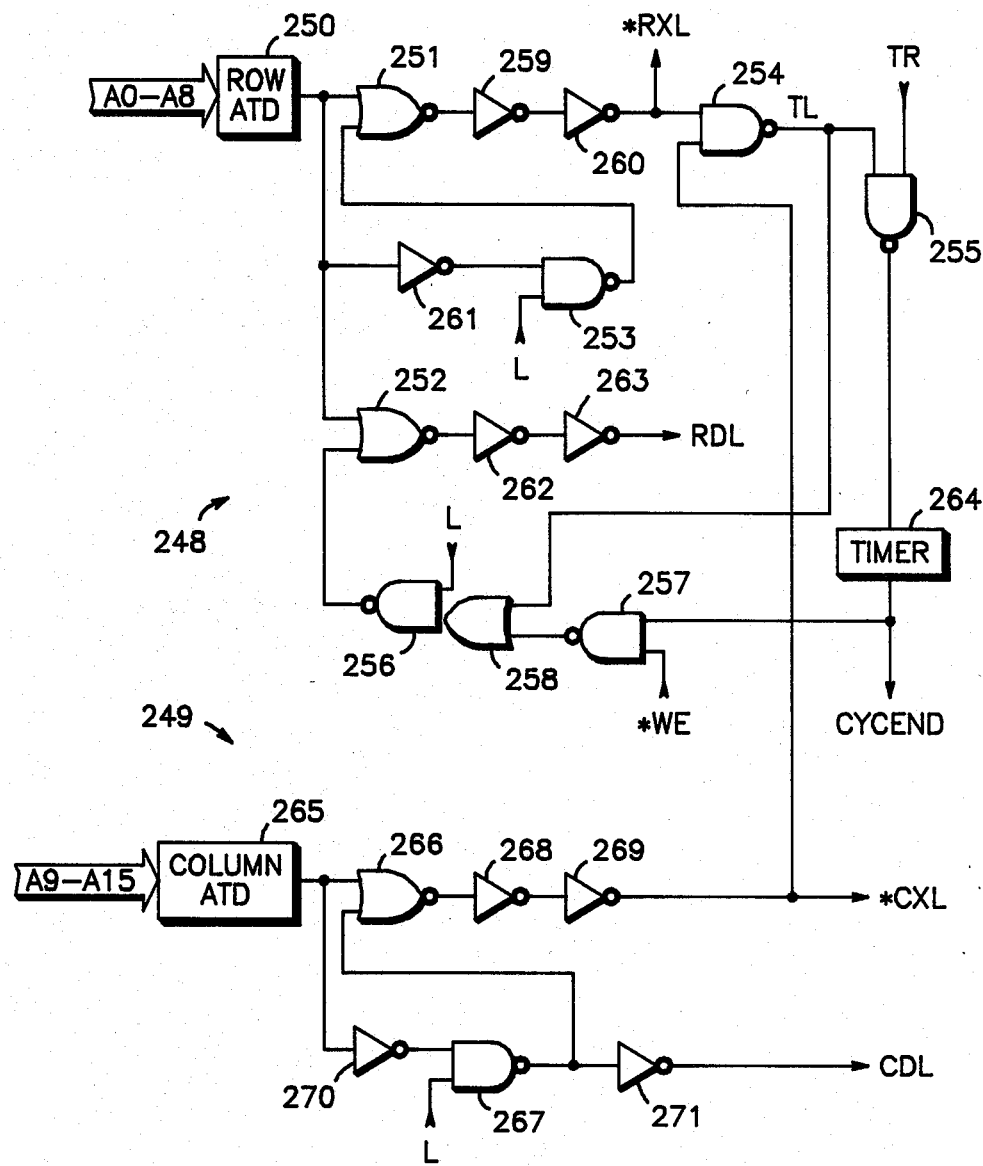
FIG. 6 is a combination block and logic diagram of a portion of the precharge and decoder control circuit of FIG. 5.

Shown in FIG. 6 is a combination block and logic diagram of a circuit 248 used in memory 10 useful in performing the function of circuit 213, and of a circuit 249 useful in performing the function of circuit 214 of FIG. 5. Circuit 248 is comprised of a row address transition detector 250, NOR gates 251 and 252, NAND gates 253, 254, 255, 256, and 257, OR gate 258, inverters 259, 260, 261, 262, and 263, and a timer 264. Circuit 249 is comprised of a column address transition detector 265, a NOR gate 266, a NAND gate 267, and inverters 268, 269, 270, and 271. Column ATD 265 receives column address signals A9-A15 and has an output which provides a positive pulse in response to a change in one or more of column address signals A9-A15. Inverter 270 has an input connected to the output of column ATD, and an output. NAND gate 267 has a first input connected to the output of inverter 270, a second input for receiving a left sub-array signal L, and an output. Inverter 271 has an input connected to the output of NAND gate 267, and an output for providing a column disable signal CDL for the left sub-arrays. NOR gate 266 has a first input for connected to the output of column ATD 265, a second input connected to the output of NAND gate 267, and an output. Inverter 268 has an input connected to the output of NOR gate 266, and an output. Inverter 269 has an input connected to the output of inverter 268, and an output for providing column transition signal *CXL for the left sub-arrays. Row ATD 250 receives row address signals A0-A8 and provides a positive pulse in response to a change in one or more of row address signals A0-A8 on its output. Inverter 261 has an input connected to the output of row ATD 250, and an output. NAND gate 253 has a first input connected to the output of inverter 261, a second input for receiving left sub-array signal L, and an output. NOR gate 251 has a first input connected to the output of row ATD 250, a second input connected to the output of NAND gate 253, and an output. Inverter 259 has an input connected to the output of NOR gate 251, and an output. Inverter 260 has an input connected to the output of inverter 259, and an output for providing a row transition signal *RXL for the left sub-arrays. NAND gate 254 has a first input connected to the output on inverter 260, a second input connected to the output of inverter 269, and an output for providing a timer signal TL for the left sub-arrays. NAND gate 255 has a first input connected to the output of NAND gate 254, a second input for receiving a timer signal TR for the right sub-arrays, and an output. Timer 264 has an input connected to the output of NAND gate 255, and an output for providing a cycle end signal CYCEND. NAND gate 257 has a first input connected to the output of timer 264, a second input for receiving a complementary write enable signal *WE, and an output. OR gate 258 has a first input connected to the output of NAND gate 257, a second input connected to the output of NAND gate 254, and an output. NAND gate 256 has a first input connected to the output of OR gate 258, a second input for receiving signal L, and an output. NOR gate 252 has a first input connected to the output of NAND gate 256, a second input connected to the output of row ATD 250, and an output. Inverter 262 has an input connected to the output of NOR gate 252, and an output. Inverter 263 has an input connected to the output of inverter 262, and an output for providing a row decoder disable signal RDL for the left sub-arrays.

Signal L, at a logic high, is indicative that one of the left sub-arrays 11-14 is selected. Signal L is a function of address signal A5. A corresponding signal R (not shown) is also generated indicative of one of the right sub-arrays 15-18 being selected. Signal *WE at a logic high is indicative that memory 10 is in a read mode.

Assuming that signal L is a logic high, circuit 249 provides signals *CXL and CDL as logic low pulses in response to Column ATD 265 providing a logic high pulse in response to a column address transition. Signals *CXL and CDL both are a logic high except when there is a column address transition. When signal L is a logic low, NAND gate 267 is forced to provide a logic high output which in turn forces NOR gate 266 to provide to provide a logic low output. Consequently, when the left sub-arrays 11-14 are deselected signals *CXL and CDL are forced to a logic low even when there is not a column address transition. Signal CDL is analogous to signal CD in FIG. 5. Signal CDL, however, enables and disables only the column decoders for left sub-arrays 11-14 not all of the sub-arrays as indicated in FIG. 5. For example, decoder 90 in FIG. 2 is disabled by signal CDL being a logic low, whereas decoder 91 does not receive signal CDL. Decoder 91 along with the other column decoders associated with the right sub-arrays are enabled by an analogous signal to signal CDL, except that it is responsive to column address transitions only when one of the right sub-arrays is selected. The actual implementation is to disable the column pre-decoders. Column pre-decoders 97-100 of sub-array 13 are disabled when signal CD is a logic low. This is achieved by forcing all of signals DEC0-DEC15 to a logic low which prevents any bit lines from being coupled to local data lines such as data line pair 124 and 125 in FIG. 3. The circuit (not shown) which generates the column disable signal for the right sub-arrays uses the output of column ATD 265 and is connected the same way as gates and inverters 266-271, except that the NAND gate analogous to NAND gate 267 receives the right sub-array signal R. As stated previously, there is a circuit 212 in FIG. 5 for each sub-array. Each circuit 212, which corresponds to left sub-arrays 11-14, receives signal *CXL as the signal analogous to signal *CX in FIG. 5. A right sub-array signal analogous to signal *CXL is for each circuit 212 which corresponds to sub-arrays 15-18.

Circuit 248 in FIG. 6 is shown as generating signals *RXL, RDL, and TL for left sub-arrays 11-14. All of circuit 248 except row ATD 250, NAND gates 255 and 257, and timer 264 are repeated for generating analogous signals for right sub-arrays 15-18. For generating the signals for the right sub-arrays, analogous gates to NAND gates 253 and 256 receive the right sub-array signal instead of signal L. When signal L is a logic high, signal *RXL provides a logic low pulse in response to row ATD providing a logic high pulse in response to a row address transition. When the left sub-arrays 11-14 are deselected, NAND gate 253 is forced to provide a logic high output which forces NOR gate 251 to provide a logic low output. Consequently, when left sub-arrays 11-14 are deselected, signal *RXL is forced to a logic low without regard to a row address transition.

When left sub-arrays 11-14 are deselected, signal TL is forced to a logic high so that NAND gate 255 and timer 264 are responsive to timer signal TR for right sub-arrays 15-18. When left sub-arrays 11-14 are deselected, NAND gate 256 is forced to provide a logic high to NOR gate 252, forcing NOR gate 252 to provide a logic low output, which in turn causes signal RDL to be a logic low without regard to row address transitions. Signal RDL, analogous to signal RD in FIG. 5, causes all of the word lines in left sub-arrays 11-14 to be deactivated. Row decoder 201 in FIG. 5 is representative of the entire row decoder circuitry which, in memory 10, includes the circuitry in block 34 which performs a partial row decode to generate the sub-array select signals, as well as global row decoders 32 and 33, and word line drivers 21-28. For memory 10, the disabling of the row decoder as described for circuit 200 in FIG. 5 is achieved by disabling the block select signals. Signal RDL at a logic low disables all of the block select signals associated with sub-arrays 11-14. The corresponding row decoder disable signal for right sub-arrays 15-18 at a logic low disables the block select signals associated with right sub-arrays 15-18.

When left sub-arrays 11-14 are selected, signal TR is a logic high so that NAND gate 255 is responsive to signal TL. Signal TL is normally a logic low but pulses to a logic high in response to a column or row address transition. When signal TL pulses to a logic high, NAND gate 255 responds by pulsing to a logic low which resets timer 264. As long as NAND gate 255 is a logic low, timer 264 will be in a reset state and will provide a logic low output to NAND gate 257. When the output of NAND gate 255 switches to a logic high, timer 264 will begin timing while maintaining a logic low output. When timer 264 has timed out, its output will switch to a logic high. Assuming memory 10 is in the read mode, NAND gate 256 will be controlled by the output of timer 264. During reset of timer 264 and while timer 264 is timing, NAND gate 257 provides a logic high output, causing OR gate 258 to provide a logic high output, which in turn causes NAND gate 256 to provide a logic low output. NOR gate 252 is thus responsive to the output of row ATD 250. When there is no row address transition, NOR gate 252 has both inputs at a logic low so that signal RDL is a logic high and the selected word line is enabled. When a row address transition causes row ATD to output a logic high pulse, NOR gate 252 causes signal RDL to pulse to a logic low, disabling all word lines for the duration of the pulse. The generation of *RXL from row ATD has the same number of stages, 3, that signal RDL has. Consequently, the occurrence of these two signals as logic low pulses is simultaneous. Because all of the word lines are ensured of being disabled during the occurrence of signal *RXL by signal RDL, all of the word lines are ensured of being disabled during equalization of the bit lines. In the write mode, NAND 257 gate is also forced to provide a logic high output so that signal RDL will not disable the word lines except during the logic low pulse of signal *RXL.

For the case in which timer 264 has timed out, NAND gate 257 provides a logic low output so long as memory 10 is in the read mode. OR gate 258 is then responsive to signal TL. Signal TL is a logic low except when it pulses to a logic high in response to a row or column address transition. When TL is a logic low, NAND gate 256 is forced to provide a logic high output in response to timer 264 timing out, which causes signal RDL to be a logic low, disabling all of the word lines. Consequently, after timer 264 has timed out, the word lines are disabled. For the case in which there is a row address transition after timer 264 has timed out, signal *RXL pulses to a logic low causing the bit lines to be equilibrated, signal TL to pulse to switch to a logic high, and timer 264 to be reset. For the case in which there is a column address transition after timer 264 has timed out, signal *CXL pulses to a logic low causing the bit lines to be precharged and signal TL to switch to a logic high. Signal TL is used to not only reset timer 264 but also to speed-up the enabling of the row decoder in the case in which timer 264 has timed out. The selected word line is thus enabled without the delay through the resetting of timer 264. Signal TL causes signal RDL to switch to a logic high about 5 ns after signal *CXL pulses to a logic low. This is timed so that signal RDL will enable the selected word line just as equilibration is terminating. If for some reason there is relatively severe row address skew so that the pulse generated by row ATD is of relatively long duration, NOR gate 252 prevents RDL from enabling the selected word line until signal *RXL is no longer actively equilibrating bit lines. By the time signal TL has switched back to a logic low, timer 264 has been reset and NAND gate 257 is providing a logic high output to ensure that the output of NAND gate 256 does not change state when signal TL switches back to a logic low.

We claim:

1. A memory circuit which has a plurality of bit line pairs which are selected by a column address and a plurality of word line lines which are selected by a row address, the bit line pairs being selectively coupled to a common data line by column decoders as determined by the column address and the word lines being selectively enabled by a row decoder as determined by the row address, a memory cell being located at each intersection of the bit line pairs and word lines, comprising:
   column detection means means providing a column transition signal for at least a predetermined time duration following a column address transition; and
   decoupling means for decoupling at least one selected bit line pair from the common data line in response to the column transition signal.

2. The memory circuit of claim 1 further comprising: precharging means for precharging the bit lines while the column transition signal is provided.

3. In a memory circuit which has a plurality of bit line pairs which are selected by a column address and a plurality of word line lines which are selected by a row address, the bit lines pairs being selectively coupled to a common data line by column decoders as determined by the column address and the word lines being selectively enabled by a row decoder as determined by the row address, a memory cell being located at each intersection of the bit line pairs and word lines, a method comprising the steps of:
  detecting a row address transition; and
  disabling the row decoder for at least a predetermined time duration following the detection of the row address transition.

4. The method of claim 3 further comprising the steps of:
  detecting a column address transition; and
  decoupling at least one selected bit line pair from the common data line for at least a second predetermined time duration following the detection of the column address transition.

5. In a memory circuit which has a plurality of bit line pairs which are selected by a column address and a plurality of word line lines which are selected by a row address, the bit line pairs being selectively coupled to a common data line by column decoders as determined by the column address and the word lines being selectively enabled by a row decoder as determined by the row address, a memory cell being located at each intersection of the bit line pairs and word lines, a method comprising the steps of:
  detecting a column address transition; and
  decoupling at least one selected bit line pair from the common data line for at least a second predetermined time duration following the detection of the column address transition.

6. A memory circuit which has a plurality of bit line pairs which are selected by a column address and a plurality of word lines which are selected by a row address, the bit line pairs being selectively coupled to a common data line by column decoders as determined by the column address and the word lines being selectively enabled by a row decoder as determined by the row address, a memory cell being located at each intersection of the bit line pairs and word lines, comprising:
  row detection means for generating a row transition signal in response to detecting a row address transition; and
  disabling means for disabling the row decoder in response to the row transition signal.

7. The memory circuit of claim 6 further comprising:
  column detection means for generating a column transition signal in response to detecting a column address transition; and
  decoupling means for decoupling the bit lines from the common data line in response to the column transition signal.

8. The memory circuit of claim 7 further comprising:
  precharging means for precharging the bit lines while the bit lines are decoupled from the common data line; and
  equalizing means for equalizing the bit lines while the word line drivers are disabled.

9. The memory circuit of claim 8 wherein the disabling means is further characterized as providing a row decoder disable signal to the row decoder in response to a row address transition to disable the row decoder.

10. The memory circuit of claim 9 further comprising a cycle end timer, coupled to the column and row detection means and to the disable means, for causing the disable means to provide the row disable signal a predetermined time period following a row or column address transition unless reset by another row or column address transition which occurs before expiration of the predetermined time period.

11. The memory circuit of claim 10 further comprising equilibration means for equilibrating the data lines in response to a column or row address transition.

12. A memory circuit which has a plurality of bit line pairs which are selected by a column address and a plurality of word line lines which are selected by a row address, the bit line pairs being selectively coupled to a common data line by column decoders as determined by the column address and the word lines being selectively enabled by a row decoder as determined by the row address, a memory cell being located at each intersection of the bit line pairs and word lines, comprising:
  row detection means for generating a row transition signal in response to detecting a row address transition;
  disabling means for disabling the row decoder in response to the row transition signal;
  a cycle end timer, coupled to the row detection means and to the disable means, for causing the disable means to disable the row decoder after a predetermined time period following a row address transition unless reset by another row address transition which occurs before expiration of the predetermined time period.

13. The memory circuit of claim 12 further comprising
  column detection means for generating a column transition signal in response to detecting a column address transition; and
  decoupling means for decoupling the bit lines from the common data line in response to the column transition signal.

14. The memory circuit of claim 13 further comprising equilibration means for equilibrating the data lines in response to a column or row address transition.

15. A memory having a plurality of memory cells coupled to word lines and bit line pairs at intersections thereof, each memory cell providing data to the bit line pair to which it is coupled when the word line to which it is coupled is enabled, comprising:
  row decoder means, coupled to the word lines, for disabling a selected word line as determined by a row address;
  column decoder means, coupled to the bit line pairs, for coupling a data line pair to a selected bit line pair as determined by a column address and for preventing any bit line pair from being coupled to the data line pair in response to receiving a column disable signal; and
  column detection means, coupled to the column decoder means, for providing the column disable signal for at least a predetermined time duration following a transition of the column address.

16. The memory of claim 15, wherein the row decoder means is further characterized as being prevented from enabling any word lines in response to receiving a row disable signal, further comprising:
  row detection means, coupled to the row decoder means, for providing the row disable signal for at least a second predetermined time duration following the transition of the row address.

17. A memory having a plurality of memory cells coupled to word lines and bit line pairs at intersections thereof, each memory cell providing data to the bit line pair to which it is coupled when the word line to which it is coupled is enabled, comprising:
  row decoder means, coupled to the word lines, for enabling a selected word line as determined by a row address, said row decoder means characterized as being prevented from enabling any word lines in response to receiving a row disable signal; column decoder means, coupled to the bit line pairs, for coupling a data line pair to a selected bit line pair as determined by a column address; and row detection means, coupled to the row decoder means, for providing the row disable for at least a predetermined time duration following a transition of the row address.

* * * * *

UNITED STATES PATENT AND TRADEMARK OFFICE
CERTIFICATE OF CORRECTION

PATENT NO. : 4,661,931

DATED : April 28, 1987

INVENTOR(S) : Stephen T. Flannagan et al

It is certified that error appears in the above-identified patent and that said Letters Patent is hereby corrected as shown below:

```
Column 14, line 51, change "means means" to --means for--.
Column 18, line 4, insert --signal-- following "disable".
```

Signed and Sealed this

Eleventh Day of August, 1987

Attest:

DONALD J. QUIGG

Attesting Officer

Commissioner of Patents and Trademarks